United States Patent
Albinet et al.

(10) Patent No.: US 6,441,760 B2
(45) Date of Patent: Aug. 27, 2002

(54) METHOD AND APPARATUS FOR DIGITAL TO ANALOG CONVERSION

(75) Inventors: Xavier Albinet, San Marino; Pascal Guigon, Mas Ricardenque, both of (FR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/821,939

(22) Filed: Mar. 30, 2001

(51) Int. Cl.⁷ .................................................. H03M 3/00
(52) U.S. Cl. ........................ 341/143; 341/144; 341/136; 341/118; 341/119
(58) Field of Search ................................. 341/143, 144, 341/118, 57, 119

(56) References Cited

U.S. PATENT DOCUMENTS

| | | | | |
|---|---|---|---|---|
| 4,079,373 A | * | 3/1978 | Brown ........................ 341/119 |
| 4,978,959 A | * | 12/1990 | Chong et al. ................ 330/252 |
| 5,010,337 A | * | 4/1991 | Hisano et al. ............... 341/119 |
| 5,369,402 A | * | 11/1994 | Kwon ........................ 341/118 |
| 5,608,401 A | * | 3/1997 | Viswanathan et al. ....... 341/143 |
| 5,614,903 A | * | 3/1997 | Oyama ........................ 341/118 |

* cited by examiner

*Primary Examiner*—Michael Tokar
*Assistant Examiner*—Lam T. Mai
(74) *Attorney, Agent, or Firm*—Pedro P. Hernandez; W. James Brady III; Frederick J. Telecky, Jr.

(57) ABSTRACT

A digital to analog converter (40) includes a pulse width modulator (14) and a class-D amplifier (16). The class-D amplifier (16) includes a low pass filter (34). A differential signal is available from two nodes (outp, outm) on the amplifier. Common mode compensation circuitry (42) generates a compensation signal during periods where a PWM signal is not being generated to maintain a common mode average value of (Avdd +Avss)/2 from the nodes, without affecting the differential signal.

17 Claims, 4 Drawing Sheets

METHOD AND APPARATUS FOR DIGITAL TO ANALOG CONVERSION

CROSS-REFERENCE TO RELATED APPLICATIONS

Not Applicable

STATEMENT OF FEDERALLY SPONSORED RESEARCH OR DEVELOPMENT

Not Applicable

BACKGROUND OF THE INVENTION

1. Technical Field

This invention relates in general to electronic circuits and, more particularly, to digital to analog converters.

2. Description of the Related Art

Digital-to-analog converters (DACs) are used in many applications where data is processed in the digital domain and converted to the analog domain. A typical example of DAC use is in cellular telephones, where voice data is communicated digitally and converted to an analog signal to drive a speaker for output to the user. DACs are used in a wide range of applications in many different devices.

In many applications, minimizing the consumption of power is extremely important since the device is powered by a battery. For portable devices such as cellular phones and portable audio equipment, a major selling factor is the size and weight of the device. Accordingly, the size, and hence the capacity, of the battery used to power the device is diminishing, while the appeal of longer battery life and output quality are increasing.

Therefore, it is beneficial to use a highly efficient class-D amplifier stage in a DAC. Unfortunately, the modulation of the class-D amplifier stage by a pulse width modulation device (PWM) results in common mode noise generation. To compensate for the common mode noise, the prior art uses a feedback control system that requires conversion of the analog output of the class-D amplifier to a digital signal to be used in the PWM. This feedback system complicates the design and increases power requirements.

Therefore, a need has arisen for a more efficient digital to analog converter, without sacrificing output quality.

BRIEF SUMMARY OF THE INVENTION

In the present invention, a digital to analog converter comprises an amplifier circuit and a pulse width modulator. The pulse width modulator generates signals on first and second nodes of amplifier circuit to create a differential signal. Compensation circuitry generates an identical signal on said first and second nodes to obtain a desired common mode average signal between said first and second nodes, such that said differential signal is not affected.

The present invention provides significant advantages over the prior art. First, the analog/ digital converter is no longer needed, because feedback is not necessary for the compensation. Thus, the circuit design is simplified and the power consumed by the analog/digital converter is eliminated. Second, the compensation signals do not affect the differential signal, resulting in a pure signal.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The present invention is best understood in relation to FIGS. 1–8 of the drawings, like numerals being used for like elements of the various drawings.

Figure 1:
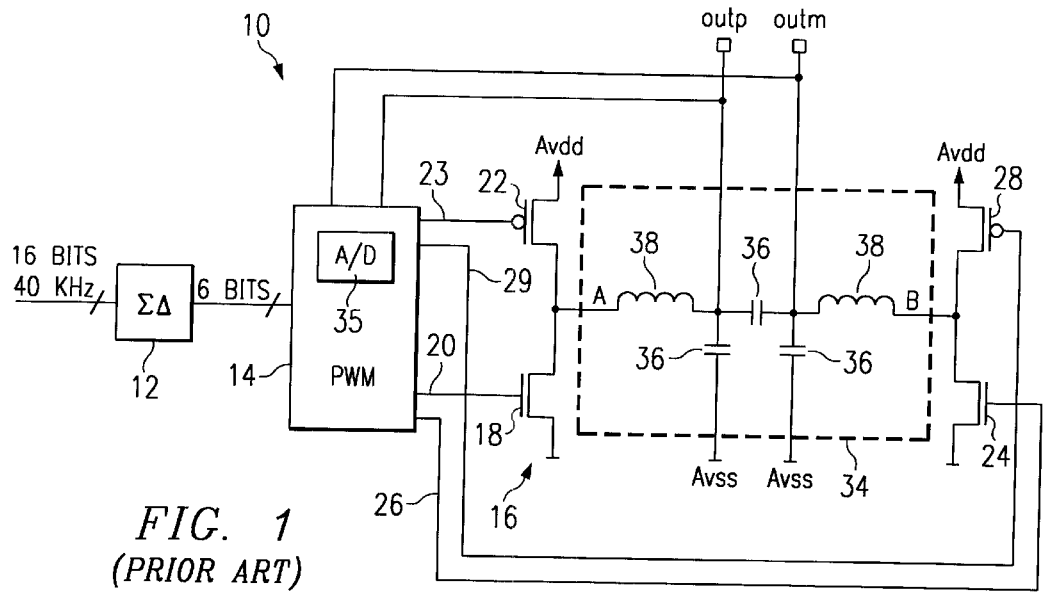
FIG. 1 is a block diagram of a prior art digital to analog converter.

FIG. 1 illustrates a block diagram of a prior art digital to analog converter 10 coupled to a class-D amplifier. A digital input, shown in FIG. 1 as a 16-bit, 40 kHz signal, is received by a multi-bit sigma-delta modulation circuit 12. The sigma-delta modulator 12 outputs six bits (at 40 KHz) to a pulse width modulation (PWM) circuitry 14. PWM 14 outputs a signal to a class D amplifier 16. Class D amplifier 16 comprises two pairs of MOS transistors. The first pair comprises an n-channel transistor 18 having a first source/drain coupled to Avss, a gate coupled to a first output 20 of PWM 14 and a second source/drain coupled to a first source/drain of a p-channel transistor 22. The gate of p-channel transistor 22 is coupled to a second output 23 of PWM 14 and the second source/drain of p-channel transistor 22 is coupled to Avdd. The second pair comprises an n-channel transistor 24 having a first source/drain coupled to Avss, a gate coupled to a third output 26 of PWM 14 and a second source/drain coupled to a first source/drain of a p-channel transistor 28. The gate of p-channel transistor 28 is coupled to a fourth output 29 of PWM 14 and the second source/drain of p-channel transistor 22 is coupled to Avdd. The differential outputs at nodes A and B of class-D amplifier 16 are coupled to a low pass filter 34, comprising capacitors 36 coupled to inductors 38. Nodes outp and outm are outputs from the low pass filter 34. The signal at outp and outm are fed back to PWM 14, where they are returned to a digital signal by A/D (analog to digital) circuitry 35.

Pulse width modulation is a very well known method for conversion of audio signals into high-frequency pulses that vary in width with the audio-signal amplitude. The output of this modulator is used to drive two n- and two p-channel MOS transistors as shown in FIG. 1.

Figure 2:
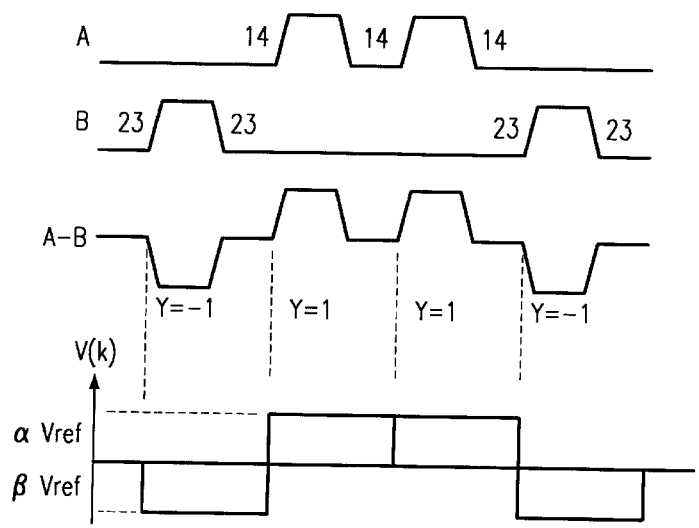
FIG. 2 is a timing diagram for the digital to analog converter of FIG. 1.

FIG. 2 illustrates the bridge differential output (A–B) as a function of the value y(k). The value y(k) is used here to simply describe the behavior of the modulator. If (A–B)= Vref at time t=kT, then y(k)=1 else if (A–B)=−Vref then y(k)=−1.

Thus the average voltage V(k) can be denoted as:
V(k)=αVref if y(k)=1
V(k)=βVref if y(k)=−1 α and β values are close to 0.5.

$$V(k) = \alpha \cdot Vref \cdot \frac{(1+y(k))}{2} - \beta \cdot Vref \cdot \frac{(1-y(k))}{2}$$

$$V(k) = \left(\frac{(\alpha-\beta)}{2} + \frac{(\alpha+\beta)}{2} \cdot y(k)\right) \cdot Vref$$

The expression for V(k) contains no second-order non-linear term. Therefore this PWM causes no harmonic distortion or quantization noise inter-modulation.

Figure 3:
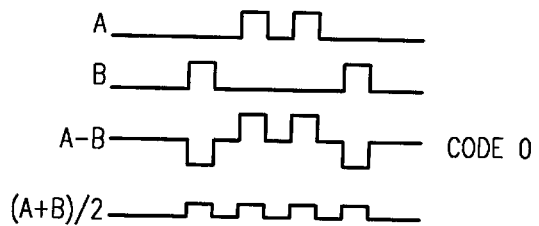
FIG. 3 is a timing diagram showing the differential and common mode voltages responsive to a signal on the bridge circuit of FIG. 1.

This modulation described above is similar to most existing modulation methods. The problem is the common mode noise generation, (A+B)/2 in the audio signal frequency due to its non-zero average value (a zero-average common mode signal has a constant value for a common mode signal in the time domain or a zero-value in the frequency domain), as depicted in FIG. 3. As the input signal changes, the common mode signal changes as well, causing common mode variations and, hence, harmonic distortion. As shown in FIG. 1, existing solutions use a feedback network to return the outputs to an A/D converter 35 to compensate this error in the PWM 14. The feedback network increases circuit complexity and also increases power requirements.

Figure 4:
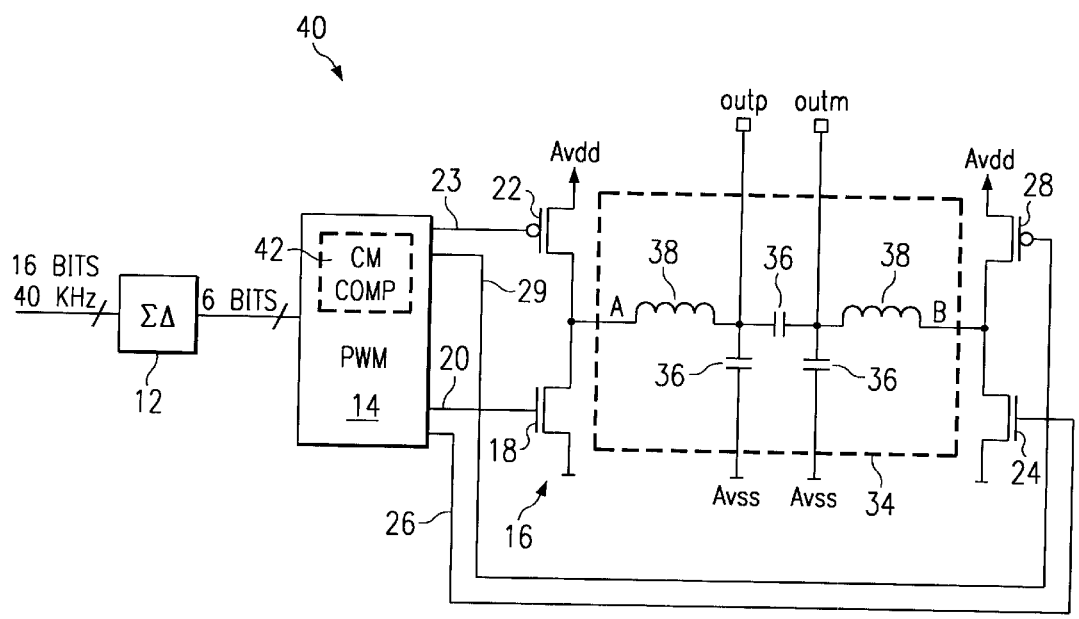
FIG. 4 illustrates a block diagram of a preferred embodiment of a digital to analog converter using common mode compensation signaling.

FIG. 4 illustrates a DAC 40 using common mode compensation circuitry to reduce common mode variation by generating a signal that does not affect the differential signal, yet creates a zero-average common mode signal. The DAC 40 is similar to the DAC 10 of FIG. 1, except no feedback loop is used and hence, no A/D circuitry is required. In this embodiment, PWM 14 includes common mode compensation circuitry 42 that generates a signal during times when no modulation signal is present from the PWM. The signal generated by the common mode compensation circuitry is a zero-averaging common mode signal that varies between Avss and Avdd with a frequency Fcomp equal to the circuit clock frequency Fcir divided by an integer Div, shown in greater detail hereinbelow.

Figure 5:
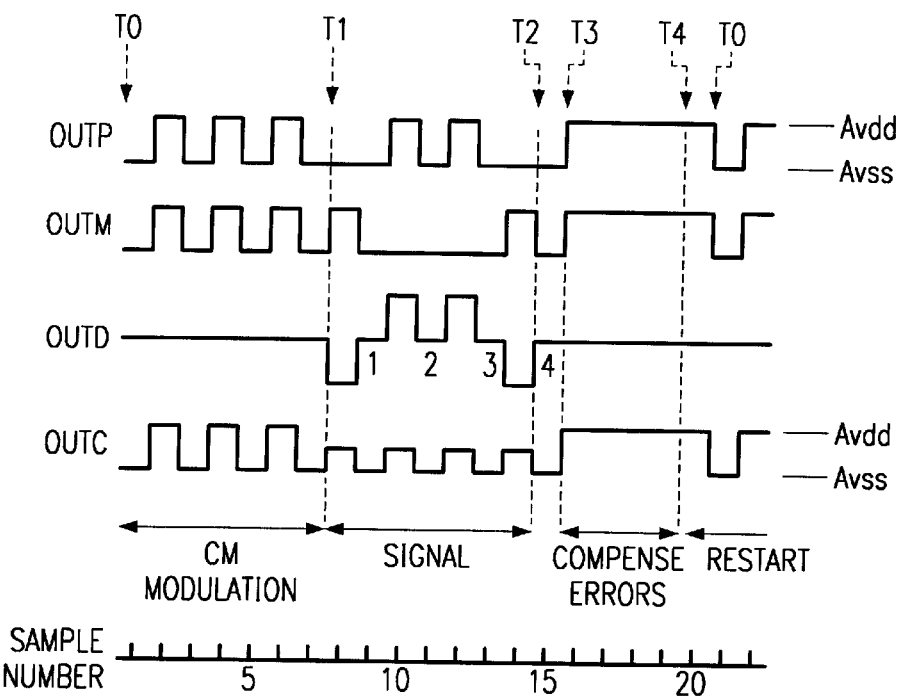
FIGS. 5 through 7 illustrate timing diagrams associated with different operational modes of the digital to analog converter of FIG. 4.

FIG. 5 illustrates a timing diagram of the DAC 40 in a first example, using a Div of "1" (i.e., the frequency of the common mode signal from the common mode compensation circuitry equals the circuit clock frequency). FIG. 5 illustrates the clock signals at nodes outp, outn, the differential signal outd (i.e., outp-outm) and the common mode signal outc (i.e., (outp+outm)/2).

Between T0 and T1, outp and outm are modulated between Avdd and Avss at a clock rate Fcomp=Fcir by the common mode compensation circuitry 42. Since the same signal is applied to both outp and outm, the differential signal outd remains at zero, just as in FIG. 3. From T1 to T3, the normal PWM signal at the bridge outputs A and B occurs. During this time, there are states ("zero" states) when the bridge outputs outp and outm have the same value, shown in FIG. 5 as states "1", "2", "3", and "4", equal to the last value before T1 (Avss in FIG. 5). During a zero state, the differential signal outd will be zero, while the common mode signal outc will be either Avss (if outp and outm are both equal to Avss) or Avdd (if outp and outm are both equal to Avss). Between the zero states are "non-zero" states where outp and outm have different states. For non-zero states, the common mode signal outc will have a value of (Avss+Avdd)/2. Between T3 and T4, the modulation from the common mode compensation circuitry 42 compensates for the four zero states by bypassing the bridge outputs and driving outp and outm to the opposite state from the outp and outc value causes the zero state (Avdd in FIG. 5) for a time period equal to the time period of states 1–4. This compensation maintains the average value of the common mode signal, but does not affect the differential signal outd. After T4, the common mode compensation circuitry 42 restarts the oscillation previously described in connection with the state between T0 and T1.

The period from T0 to T0 is constant, as is the period from T3 to T4, since states "1". "2", "3" and "4" have a constant duration. The non-zero states between T1 and T3 will vary with the input. Hence, the period from T0 to T1 varies inversely with the period from T1 to T3 to maintain a constant T0 to T0 period.

The following equations describe the common mode signal, outc, between T0 and T4. From T0 to T1, outc can be described as:

$$\Sigma CM01 = (Avss + Avdd) + (Avss + Avdd) + (Avss + Avdd) + Avss$$

$$= 6*(Avss + Avdd)/2 + Avss$$

Similarly, from T1 to T3, outc can be described as:

$$\Sigma CM13=(Avdd+Avss)/2+Avss+(Avdd+Avss)/2+Avss+(Avdd+Avss)/2+Avss+(Avdd+Avss)/2+Avss=4* (Avss+Avdd)/2+4* Avss$$

From T3 to T4, outc can be described as:

$$\Sigma CM34=Avdd+Avdd+Avdd+Avdd=4*Avdd$$

Accordingly, outc from T0 to T4 can be described as.

$$\Sigma CM04=\Sigma CM01+\Sigma CM13+CM34=18* (Avdd+Avss)/2+Avss$$

After T4, the algorithm continues. Since the value before T1 is Avss and Div=1, after T4, outc=Avdd. Accordingly, at the twentieth time sample, the common mode average value is:

$$[[18* (Avdd+Avss)/2+Avss]+Avdd]/20=(Avdd+Avss)/2$$

It can thus be seen that the common mode signal from T0 to T1 (the full period of which is completed from T4 to T0) is a clock that varies between Avss and Avdd with a 50% duty cycle. This portion of the compensation signal will always result in a common mode signal having an average of (Avss+Avdd)/2. The portion of the compensation signal from T3 to T4 together with the zero state portions of the actual data signal between T1 and T3 will always have a common mode signal having an average of (Avss+Avdd)/2. The remaining portions of the common mode signal, those associated with the non-zero states of the actual data signal between T1 and T3, will always have a value of (Avss+Avdd)/2. Accordingly, the common mode signal from T0 to T0 will always have an average of (Avss+Avdd)/2 . Consequently, the average common mode signal does not change from T0 to T0 and thus the common mode signal has a zero average.

Figure 6:
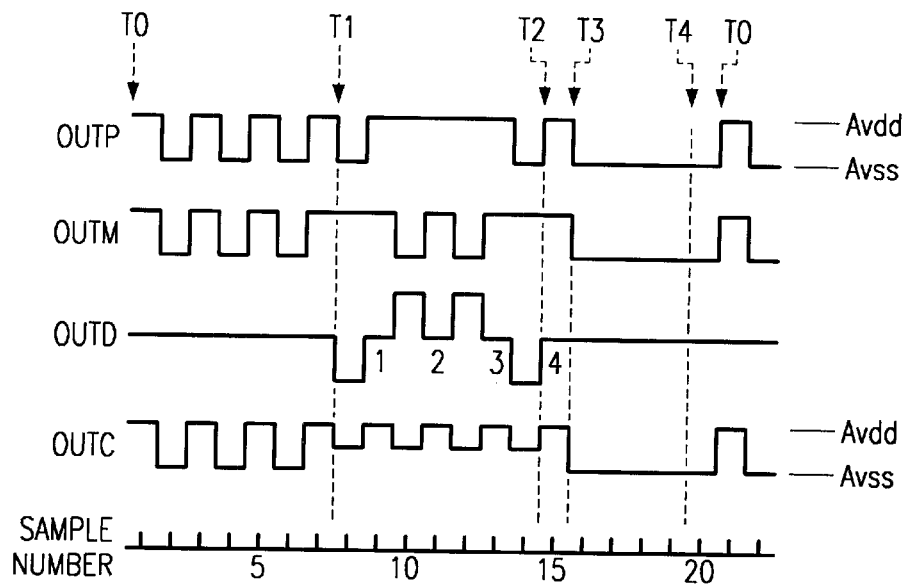
Figure 7:
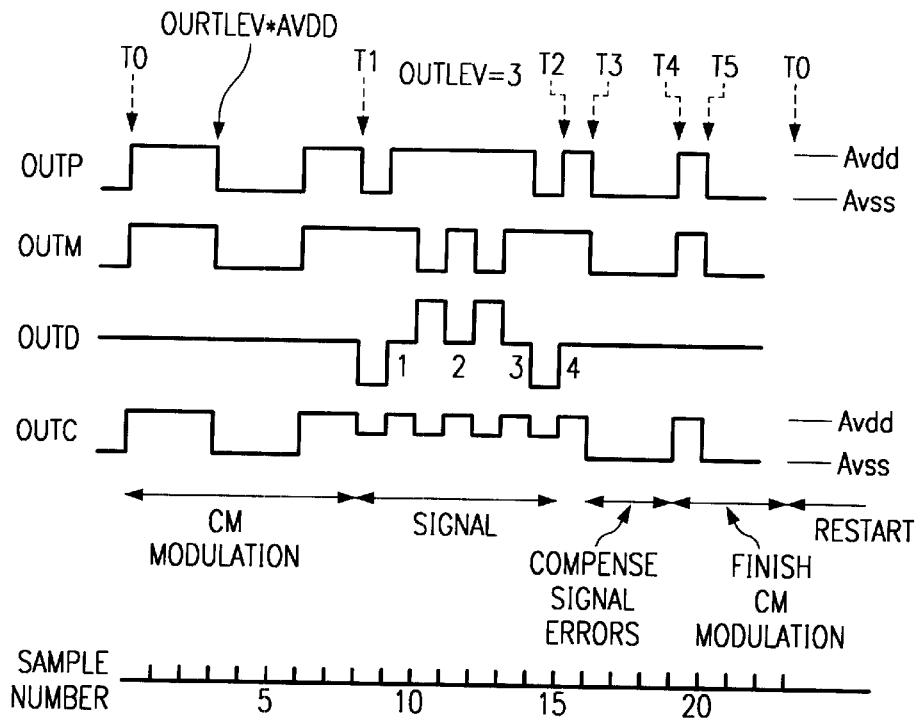

FIG. 6 illustrates a second example with Div=1. Between T0 and T1, outp and outm are modulated by the common mode compensation circuitry between Avdd and Avss at a clock rate Fcomp=Fcir. In this case, the modulation starts and ends at Avdd, as opposed to FIG. 5, where the modulation started and ended at Avss. From T1 to T3, the normal PWM signal at the bridge outputs A and B occurs. During this time, there are states when the bridge outputs outp and outm have the same value, equal to the last value before T1 (Avdd in FIG. 6), again shown in FIG. 6 as states "1", "2", "3", and "4". Between T3 and T4, the modulation from the common mode compensation circuitry 42 compensates for these four states by bypassing the bridge outputs and driving outp and outm to the opposite state (Avss in FIG. 6) for a time period equal to the time period of states 1–4. This compensation maintains the average value of the common mode signal. After T4, the modulator restarts the oscillation previously described in connection with the state between T0 and T1.

Once again, it can be shown that the common mode average value is (Avdd+Avss)/2:

$$\Sigma CM01 = (Avdd + Avss) + (Avdd + Avss) + (Avdd + Avss) + Avdd$$

$$= 6*(Avss + Avdd)/2 + Avdd$$

$$\Sigma CM13 = (Avdd+avss)/2+Avdd+(Avdd+Avss)/2+Avdd+(Avdd+Avss)/2+Avdd+(Avdd+Avss)/2+Avdd = 4* (Avss+Avdd)/2+4* Avdd$$

$$\Sigma CM34 = Avss+Avss+Avss+Avss = 4* Avss$$

$$\Sigma CM04 = \Sigma CM01 + \Sigma CM13 + \Sigma CM34 = 18* (Avdd+Avss)/2 + Avdd$$

After T4, the algorithm continues, the value before T1 is Avdd so after t4 outc=Avss. At this time, number of samples is 20, so the common mode average value is:

$$[[18* (Avdd+Avss)/2+Avdd]+Avss]/20=(Avdd+Avss)/2$$

Div can be used to control power consumption levels. The third example, shown in FIG. 7, uses Div=3.

Between T0 and T1, outp and outm are modulated at a frequency Fcomp=Fcir/3. At T1, the PWM signal begins. From T1 to T3, there are states when the bridge outputs outp and outm have the same value, equal to the last value before T1 (Avdd in FIG. 7), shown in FIG. 7 as states "1", "2", and "3" and "4". From T3 through T5, the compensation is applied to outp and outm to produce a common mode average value of (Avdd+Avss)/2. The portion of the compensation signal from T3 to T4 compensates for the zero-states between T1 and T3. The portion of the compensation signal between T4 and T0 completes the compensation clock cycle started, but not completed, from T0 to T1.

The equations describing the behavior of the circuit are as follows:

$$\Sigma CM01 = 3* (Avdd+Avss) + 2* Avdd$$

$$\Sigma CM13 = (Avdd+Avss)/2+Avdd+(Avdd+Avss)/2+Avdd+(Avdd+Avss)/2+Avdd+(Avdd+Avss)/2+Avdd = 4* (Avss+Avdd)/2+4* Avdd$$

$$\Sigma CM34 = Avss+Avss+Avss+Avss = 4* Avss$$

$$\Sigma CM45 = Avdd$$

$$\Sigma CM05 = \Sigma CM01 + \Sigma CM13 + \Sigma CM34 + \Sigma CM45 = 18* (Avdd+Avss)/2 + 3* Avdd$$

After T4, the algorithm continues, the value before T1 is 2* Avdd and Div=3, so after T4, outc=1*Avdd. From T5 to T6, outc=3*Avss, such that the overall clock modulation signal, T0 through T1 and T4 through T6 averages to (Avdd+Avss)/2. At this time, number of samples is 24, so the common mode average value is:

$$[[18* (Avdd+Avss)/2+3* Avdd]+3* Avss]/24=(Avdd+Avss)/2$$

Simulations have shown that increasing Div reduces power consumption and increases in-band noise.

In each of the three examples, the common mode compensation circuitry causes the output to have a common mode average value equal to (Avdd+Avss)/2. This is accomplished while maintaining the same differential mode voltage as shown in FIG. 1, which has no harmonic distortion or quantization noise intermodulation. This is accomplished without the use of network feedback to control the common mode voltage.

Figure 8:
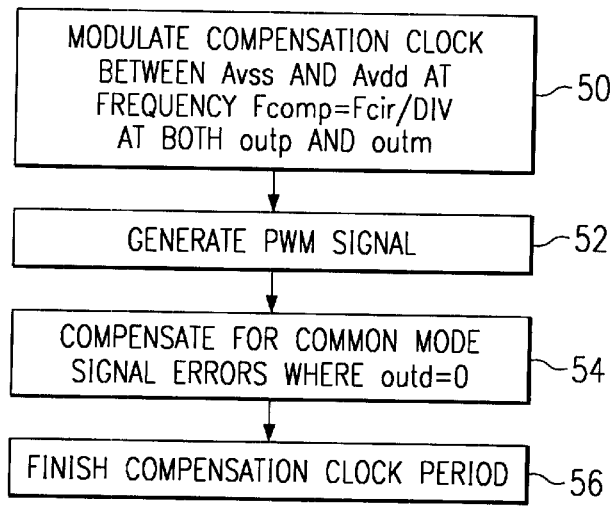
FIG. 8 illustrates a flow chart describing the operation of the common mode compensation circuitry.

FIG. 8 illustrates a flow chart describing the method of generating the signal to compensate errors. In block 50, the compensation clock modulates outp and outc between Avdd and Avss (shown in FIGS. 5–7 as the period between T0 and T1). In block 52, the normal PWM signal generates a differential signal on outp and outc. In block 54, common mode errors are compensated by holding outp and outc at either Avdd or Avss (as necessary) for a predetermined time period. In block 56, if the compensation clock in step 50 did not complete its full period, the remainder of the period is generated, such that the common mode voltage average applicable to block 50 and block 56 is (Avdd+Avss)/2.

As a result, the compensation clock of blocks 50 and 56 have a common mode average of (Avdd+Avss)/2 and the compensation mode errors of the PWM signal where outd=0 along with the compensation signal of block 54 have a common mode average of (Avdd+Avss)/2.

In operation, the operation of the common mode compensation circuitry 42 as shown in FIG. 8 could be implemented using a state machine.

The present invention provides significant advantages over the prior art. With an ideal Div value, the performance of the DAC is independent of non-ideal effects such as bridge asymmetric or low-pass LC filter asymmetric due to device non-idealities (R±10%, L±10%). The common mode noise is low in the in-band signal, so there is no impact on the bridge differential output. With this modulation method, the bridge allows the generation of a differential mode signal with no harmonic distortion as a result of the non-existence of common mode noise in the audio frequency. Further, network feedback to control the common mode voltage is unnecessary.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the Claims.

What is claimed is:

1. A digital to analog converter comprising:
   an amplifier circuit;
   a pulse width modulator for generating signals on first and second nodes of amplifier circuit to create a differential signal responsive to an input;
   compensation circuitry for generating an identical signal on said first and second nodes without affecting said differential signal to obtain a zero-averaging common mode signal.

2. The digital to analog converter of comprising:
   an amplifier circuit;
   a pulse width modulator for generating signals on first and second nodes of the amplifier circuit to create a differential signal responsive to an input;
   compensation circuitry for generating an identical signal on said first and second nodes without affecting said differential signal to obtain a desired common mode average signal; and
   a multi-bit sigma-delta modulation circuit coupled to the pulse width modulator.

3. The digital to analog converter of claim 2, wherein the compensation signal is generated by the compensation circuitry during times when no signals are present from the pulse width modulator.

4. The digital to analog converter of claim 2, wherein no feedback loop is used between the first and second nodes and the compensation circuitry.

5. The digital to analog converter of claim 2 wherein said amplifier includes a filter.

6. A digital to analog converter comprising:
   a class-D amplifier circuit;
   a pulse width modulator for generating signals on first and second nodes of the amplifier circuit to create a differential signal responsive to an input;
   compensation circuitry for generating an identical signal on said first and second nodes without affecting said differential signal to obtain a desired common mode average signal.

7. A digital to analog converter comprising:
   an amplifier circuit;
   a pulse width modulator for generating signals on first and second nodes of the amplifier circuit to create a differential signal responsive to an input;
   compensation circuitry for generating an identical signal on said first and second nodes without affecting said differential signal to obtain a desired common mode average signal; and
   wherein said compensation circuitry comprises circuitry for:
   modulating said first and second nodes between first and second voltage levels; and
   generating a signal on said first and second nodes at a third voltage level.

8. The digital to analog converter to claim 7 wherein said third voltage level equals said first voltage level.

9. The digital to analog converter to claim 7 wherein said third voltage level equals said second voltage level.

10. The digital to analog converter of claim 7 wherein said first and second nodes are modulated between the first and second voltage levels at a frequency (Fcomp) equal to a clock frequency (Fcir) divided by an integer.

11. A method of performing digital to analog conversion, comprising the steps of:
    generating a pulse width modulated signal on first and second nodes of an amplifier circuit to create a differential information signal;
    generating a compensation signal on said first and second nodes without affecting said differential signal to obtain a desired common mode average signal on said first and second nodes, the compensation signal is a zero-averaging common mode signal.

12. The method of claim 11 wherein said step of generating a compensation signal comprises the steps of:
    modulating said first and second nodes between first and second voltage levels; and
    generating a signal on said first and second nodes at a third voltage level.

13. The method of claim 12 wherein said first and second nodes are modulated between the first and second levels at a frequency (Fcomp) equal to a clock frequency (Fcir) divided by an integer.

14. A method of performing digital to analog conversion, comprising the steps of:
    generating a pulse width modulated signal on first and second nodes of an amplifier circuit to create a differential information signal;
    generating an identical compensation signal on said first and second nodes without affecting said differential signal to obtain a desired common mode average signal on said first and second nodes; and
    generating a first modulated signal using a multi-bit sigma-delta modulation circuit.

15. A method of performing digital to analog conversion, comprising the steps of:
    generating a pulse width modulated signal on first and second nodes of class-D amplifier to create a differential information signal;
    generating an identical compensation signal on said first and second nodes without affecting said differential signal to obtain a desired common mode average signal on said first and second nodes;
    generating a first modulated signal using a multi-bit sigma-delta modulation circuit; and
    wherein said step of generating a pulse width modulated signal comprises generating a pulse width modulated signal on the first and second nodes of the class-D amplifier.

16. A method of performing digital to analog conversion, comprising the steps of:
    generating a pulse width modulated signal on first and second nodes of an amplifier circuit that includes a filter to create a differential information signal;
    generating an identical compensation signal on said first and second nodes without affecting said differential signal to obtain a desired common mode average signal on said first and second nodes; and
    the step of generating a pulse width modulated signal comprises generating a pulse width modulated signal on the first and second nodes of the amplifier circuit.

17. A method of performing digital to analog conversion, comprising the steps of:
    generating a pulse width modulated signal on first and second nodes of an amplfier circuit to create a differential information signal;
    generating an identical compensation signal on said first and second nodes without affecting said differential signal to obtain a desired common mode average signal on said first and second nodes; and
    wherein said step of generating a signal on said first and second nodes at a third voltage level comprises the step of generating a signal on said first and second nodes at said first voltage level.

* * * * *